United States Patent [19]

Miyazawa

[11] Patent Number: 5,017,507
[45] Date of Patent: May 21, 1991

[54] METHOD OF FABRICATING SEMICONDUCTOR INTEGRATED CIRCUIT DEVICES INCLUDING UPDIFFUSION TO SELECTIVELY DOPE A SILICON LAYER

[75] Inventor: Hideyuki Miyazawa, Ohme, Japan
[73] Assignee: Hitachi, Ltd., Tokyo, Japan
[21] Appl. No.: 331,809
[22] Filed: Apr. 3, 1989

[30] Foreign Application Priority Data

Apr. 5, 1988 [JP] Japan ................................ 63-84748

[51] Int. Cl.[5] ........................................ H01L 21/225
[52] U.S. Cl. ...................... 437/162; 437/41; 437/52; 437/193; 437/60; 437/918; 437/934
[58] Field of Search ................ 437/162, 193, 57, 40, 437/41, 52, 160, 60, 918, 934

[56] References Cited

U.S. PATENT DOCUMENTS

| | | | |
|---|---|---|---|
| 4,648,175 | 3/1987 | Metz, Jr. et al. | 437/193 |
| 4,701,423 | 10/1987 | Szluk | 437/57 |
| 4,742,018 | 3/1988 | Kimura et al. | 437/48 |
| 4,774,203 | 9/1988 | Ikeda et al. | 437/52 |
| 4,855,248 | 8/1989 | Aziizumi et al. | 437/49 |

Primary Examiner—Brian E. Hearn
Assistant Examiner—T. N. Quach
Attorney, Agent, or Firm—Antonelli, Terry, Stout & Kraus

[57] ABSTRACT

A method of fabricating semiconductor integrated circuit devices in which a wiring is connected, via a silicon film, to a semiconductor region which is the source region or the drain region of a MISFET. The method comprises a step for introducing impurities for forming a semiconductor region of the MISFET to shallowly form the semiconductor region, a step for forming a silicon film on the main surface of the semiconductor substrate in the region where the impurities are introduced, and a step for diffusing impurities into the semiconductor substrate and for diffusing impurities into a silicon film by the heat treatment so that the silicon film is permitted to possess electric conductivity.

24 Claims, 10 Drawing Sheets

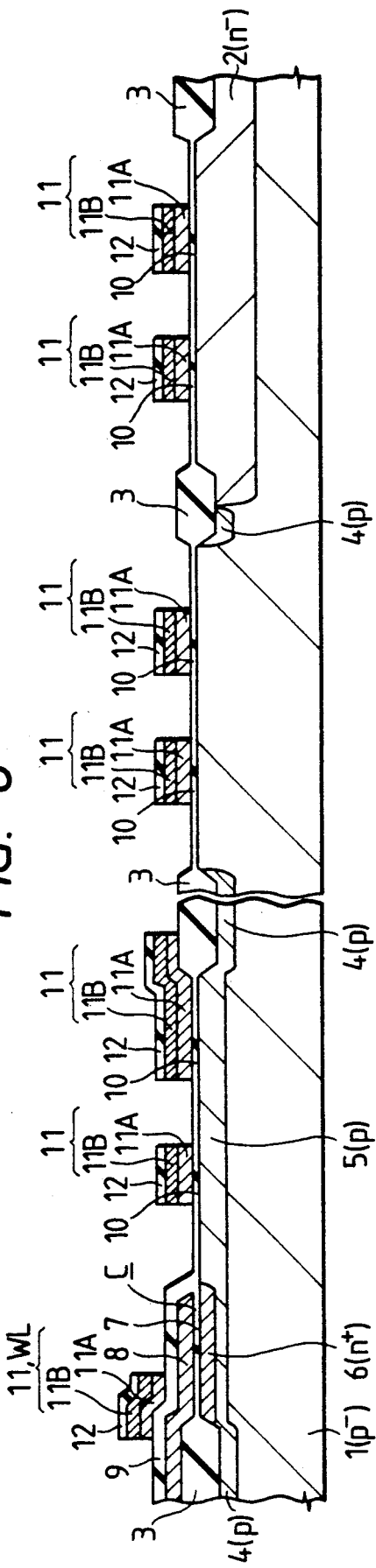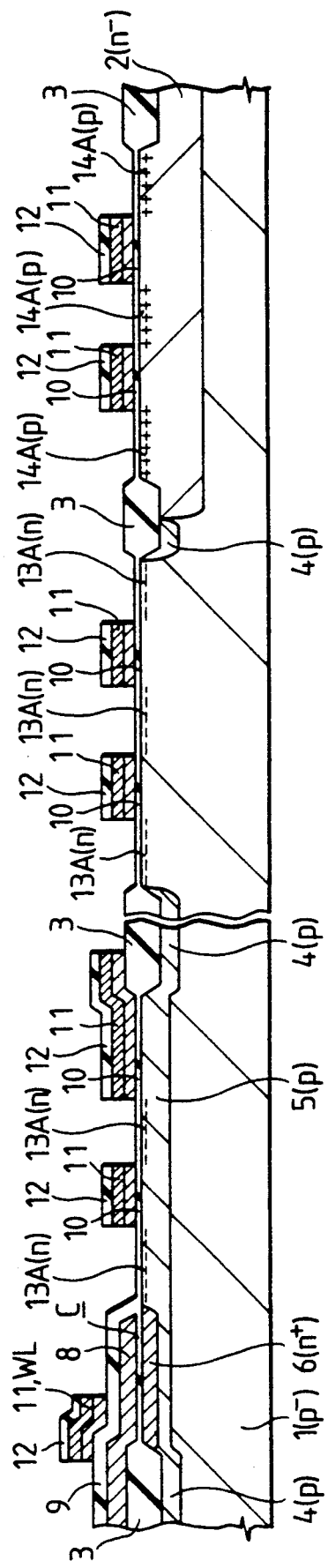

METHOD OF FABRICATING SEMICONDUCTOR INTEGRATED CIRCUIT DEVICES INCLUDING UPDIFFUSION TO SELECTIVELY DOPE A SILICON LAYER

BACKGROUND OF THE INVENTION

The present invention relates to a semiconductor integrated circuit device. More specifically, the invention relates to technology that can be effectively adapted to a semiconductor integrated circuit device in which a wiring is connected to the source region or the drain region of a MISFET via a silicon film.

The semiconductor integrated circuit device having DRAM (dynamic random access memory) which is now being developed by the present inventors has memory cells each being constituted by a memory cell select MISFET and a capacitor element for storing data. The memory cell select MISFET of the memory cell is constituted by an n-channel of the LDD (lightly doped drain) structure. The capacitor element for storing data has a so-called planar structure in which a dielectric film and a plate electrode (upper electrode) are stacked in this order on the main surface of an n-type semiconductor region (lower electrode). The memory cell consists of a series circuit in which one semiconductor region of the memory cell select MISFET is connected to the lower electrode of the capacitor element for storing data.

The other semiconductor region of the memory cell select MISFET in the memory cell is connected to a data line via an intermediate electrically conductive film.

The data line is chiefly composed of aluminum having small resistance in order to increase the speed of operation for writing data onto the DRAM and to increase the speed of operation for reading the data.

The intermediate electrically conductive film is composed of a polycrystalline silicon film, and is connected to the other semiconductor region of the memory cell select MISFET in a region specified by a side wall spacer that is formed on the side wall of the gate electrode of the memory cell select MISFET. The side wall spacer is formed on the side wall of the gate electrode in a self-aligned manner. Therefore, the region specified by the side wall spacer is self-aligned with respect to the gate electrode. That is, the position where the intermediate electrically conductive film and the other semiconductor region are connected together is self-aligned with respect to the gate electrode of the memory cell select MISFET. An end of the intermediate electrically conductive film is drawn onto the gate electrode of the memory cell select MISFET. That is, the intermediate electrically conductive film is so constituted as can be reliably connected to the data line even in case the masking is deviated in the step of fabrication. The intermediate electrically conductive film and the gate electrode are electrically isolated from each other.

The intermediate electrically conductive film is formed by a method described below.

First, one and the other semiconductor regions (source region and drain region) of a memory cell select MISFET are formed.

Then, a side wall spacer is formed on the side wall of a gate electrode of the memory cell select MISFET. In this step or in the next step, a connection hole is formed on the other semiconductor region of the memory cell select MISFET within a region specified by the side wall spacer.

Next, a polycrystalline silicon film is deposited so as to come into contact with the other semiconductor region through the connection hole. The polycrystalline silicon film does not contain impurities for controlling the resistance or contains impurities at a low concentration.

N-type impurities (P or As ions) are introduced at a high concentration into the polycrystalline silicon film followed by the heat treatment so that the polycrystalline silicon film possesses a predetermined small resistance.

The polycrystalline silicon film is patterned into a predetermined shape thereby to form an intermediate electrically conductive film.

Then, an interlayer insulating film is formed on the intermediate electrically conductive film, and a connection hole is formed in the interlayer insulating film on the intermediate electrically conductive film. A data line is formed on the interlayer insulating film so as to come into contact with the surface of the intermediate electrically conductive film through the connection hole.

The intermediate electrically conductive film thus formed helps increases the masking margin in the step for forming the other semiconductor region of the memory cell select MISFET through up to the step for forming the data line. That is, there is no need of maintaining a masking margin between the connection hole and the other semiconductor region of the memory cell select MISFET, and the other semiconductor region of the memory cell select MISFET can be reduced. Therefore, the area occupied by the memory cell is reduced and the integration degree of the DRAM can be increased.

The DRAM which uses such an intermediate electrically conductive film has been described, for example, in U.S. Ser. No. 241,732 (filed Sept. 8, 1988).

SUMMARY OF THE INVENTION

The present inventors have discovered the following problems that are inherent in the aforementioned semiconductor integrated circuit device having DRAM.

In the DRAM mentioned above, the intermediate electrically conductive film is formed after there are formed the source region and the drain region of a memory cell select MISFET in a memory cell. The source region and drain region are formed by implanting n-type impurities (As or P ions) into the main surface of a semiconductor substrate, and subjecting the n-type impurities to the diffusion (anneal) processing. The intermediate electrically conductive film is formed by introducing n-type impurities into the polycrystalline silicon film by the thermal diffusion method or the ion implantation method, and activating the n-type impurities through the heat treatment at 900° to 950° C. The source region and drain region of the memory cell select MISFET are further spread and diffused by the processing for activating the intermediate electrically conductive film. N-type impurities are further introduced from the intermediate electrically conductive film into at least the other semiconductor region of the memory cell select MISFET due to the heat treatment for activation. That is, the pn junction between the source region and the drain region of the memory cell select MISFET is further deepened (xj increases) due to the heat treatment for the intermediate electrically conductive film and the eventual introduction of impurities from the intermediate electrically conductive film into the other semiconductor region of the memory cell select MISFET. In the thus formed memory cell select MISFET, the channel must have an increased length to prevent the occurrence of short channel effect, which is detrimental to increasing the degree of integration.

The intermediate electrically conductive film is patterned using an etching mask such as a photoresist film. During the steps of fabrication, therefore, the intermediate electrically conductive film is deviated from the gate electrode of the memory cell select MISFET, and the amount of superposition changes relative to the gate electrode. The intermediate electrically conductive film is connected to the data line and the gate electrode is connected to the word line. Therefore, a change in the above-mentioned superposition is equal to the change in the coupling capacitance between the data line and the word line. Namely, variance develops in the coupling capacitance and variance also develops in the time for rising the word line. Margin therefore is required for the rising, which is detrimental to increasing the operation speed of the DRAM.

Accompanying the trend toward fabricating the DRAM highly densely, furthermore, the intermediate electrically conductive film has now been formed not only in the memory cell array but also in the peripheral circuits. The peripheral circuit of DRAM that is now being developed by the present inventors is constituted by the complementary MISFET (CMOS). The intermediate electrically conductive film connected to the source region or the drain region of the n-channel MISFET is composed of a polycrystalline silicon film to which n-type impurities are introduced. The intermediate electrically conductive film connected to the source region or drain region of the p-channel MISFET is composed of a polycrystalline silicon film to which p-type impurities are introduced. That is, two types of intermediate electrically conductive films containing impurities of different types of conductivities are formed requiring the introduction of impurities two times and the formation of masks two times. Consequently, the semiconductor integrated circuit device is fabricated through an increased number of steps or requiring an increased period of time for fabrication.

The object of the present invention is to provide technology which is capable of increasing the degree of integration of a semiconductor integrated circuit device in which a wiring is connected to the source region or the drain region of a MISFET via an intermediate electrically conductive film.

Another object of the present invention is to provide technology which is capable of achieving the above-mentioned object by preventing the short channel effect from taking place in the MISFET.

A further object of the present invention is to provide technology which is capable of increasing the operation speed of the semiconductor integrated circuit device.

Still further object of the present invention is to provide technology which is capable of achieving the above-mentioned objects by eliminating the masking deviation between the step for forming the gate electrode of the MISFET and the step for forming the intermediate electrically conductive film.

Yet further object of the present invention is to provide technology which is capable of decreasing the number of steps for fabricating the semiconductor integrated circuit device in which the wiring is connected to the source region or the drain region of the complementary MISFET's via an intermediate electrically conductive film.

A further object of the present invention is to provide technology which is capable of reducing the time for fabricating the semiconductor integrated circuit device in which the wiring is connected to the source region or the drain region of the complementary MISFET's via an intermediate electrically conductive layer.

The above and other objects as well as novel features of the present invention will become obvious from the following description of the specification and the accompanying drawings.

Among the inventions disclosed herein, representative examples will now be described briefly.

In a semiconductor integrated circuit device in which the wiring is connected to a semiconductor region of a MISFET via an intermediate electrically conductive film, impurities for forming the semiconductor region are introduced into a substrate, a silicon film is formed on the surface thereof, the impurities are then spread and diffused to form the semiconductor region in the substrate, and the impurities are further diffused into the silicon film to form an intermediate electrically conductive film.

In a semiconductor integrated circuit device in which the wiring is connected to a semiconductor region of a first type of conductivity and to a semiconductor region of a second type of conductivity of a complementary MISFET via intermediate electrically conductive films, furthermore, impurities for forming the semiconductor regions of the first type of conductivity and second type of conductivity are introduced into a substrate, a silicon film is formed on the surface thereof, the impurities are spread and diffused thereby to form semiconductor regions of the first type of conductivity and of the second type of conductivity, and the impurities are further diffused into the silicon film to form intermediate electrically conductive films.

Furthermore, a mask is selectively formed on the silicon film in which the impurities are diffused, and the silicon film in which the impurities are not diffused is removed by using the mask while leaving the silicon film in which the impurities are diffused in order to form an intermediate electrically conductive film.

According to the above-mentioned means, the semiconductor regions of the MISFET and the intermediate electrically conductive films can be formed by introducing the impurities only one time and spreading and diffusing the impurities only one time. Therefore, the pn junction of the semiconductor region becomes shallow, the short channel effect is prevented from developing, and the resistance of the intermediate electrically conductive film decreases, making it possible to increase the degree of integration of the semiconductor integrated circuit device.

By utilizing the impurities for forming a first semiconductor region of the complementary MISFET and the impurities for forming a second semiconductor region, furthermore, resistances of the intermediate electrically conductive films can be decreased that are connected to the first semiconductor region and to the second semiconductor region of the complementary MISFET, respectively. Accordingly, the number of steps for fabricating the semiconductor integrated circuit can be reduced by amounts that correspond to the steps for introducing impurities into the silicon film connected to the first semiconductor region and for introducing impurities into the silicon film connected to the second semiconductor region (i.e., can be reduced by amounts corresponding to the step for forming the mask twice, the step for introducing the impurities twice and the step of heat treatment). Furthermore, the impurities are diffused into the silicon film connected to the first semiconductor region and the impurities are diffused into the silicon film connected to the second semiconductor region substantially in the same step, contributing to decreasing the number of steps for fabricating the semiconductor integrated circuit (shortening the time for fabrication).

Furthermore, the silicon film is patterned being self-alinged to the gate electrode of the MISFET maintaining a size specified by the amount of the impurities diffused, and the masking deviation is prevented in the steps of fabrication. Consequently, no variance develops in the coupling capacitance between the gate electrode and the intermediate electrically conductive film, making it possible to increase the operation speed of the semiconductor integrated circuit device.

Described below is an embodiment in which the present invention is adapted to a semiconductor integrated circuit having DRAM.

In all of the drawings for explaining the embodiment, those having the same function are denoted by the same reference numerals and their description is not repeated

BRIEF DESCRIPTION OF THE DRAWINGS

FIGS. 3 to 13 are section views of major portions for explaining the steps for fabricating the DRAM;

DESCRIPTION OF THE PREFERRED EMBODIMENTS

Figure 1:
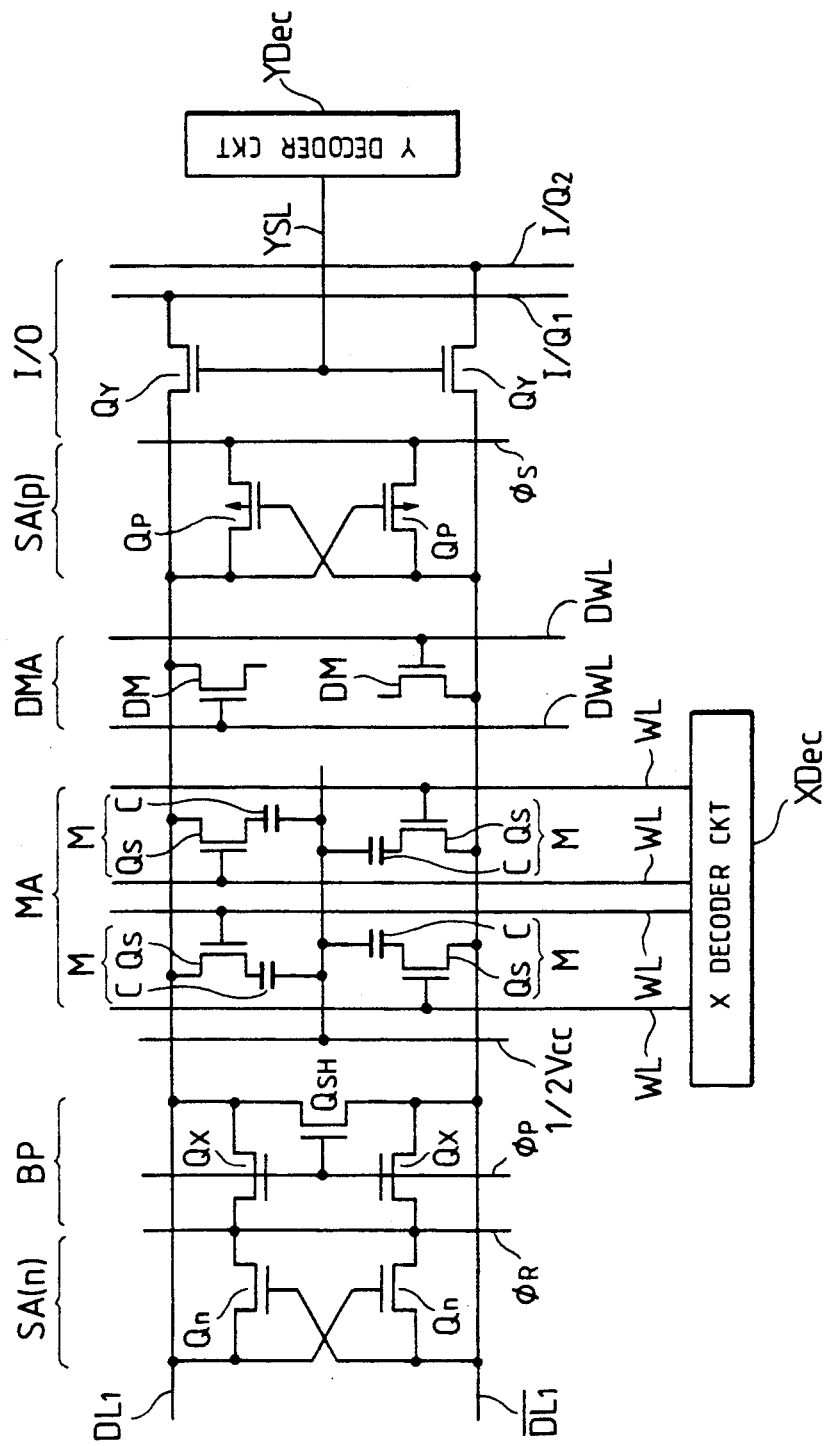
FIG. 1 is a diagram of equivalent circuits including a memory cell unit of DRAM of a semiconductor integrated circuit device and peripheral circuit regions thereof according to the present invention.

FIG. 1 (diagram of equivalent circuits of major portions) illustrates the constitution of a DRAM according to an embodiment of the present invention In FIG. 1, memory cells M are arranged in many number in the form of a matrix in a memory cell array (memory cell mat) MA of a DRAM which employs the folded bit line system. The memory cells M are arranged at the portions where a pair of data lines $DL_1$, $\overline{DL_1}$ that extend in parallel in the column direction and the word lines WL that extend in the row direction intersect each other.

The memory cell M is constituted by a series circuit of a memory cell select MISFET Qs and a capacitor element C for storing data. The memory cell select MISFET Qs is constituted by an n-channel. One semiconductor region of the memory cell select MISFET Qs is connected to the data line $DL_1$ (or $\overline{DL_1}$), and its other semiconductor region is connected to one electrode of the capacitor element C which stores data. The gate electrode is connected to the word line WL. The other electrode of the capacitor element C for storing data is connected to the power source voltage ½ Vcc which is a potential (about 2.5 V) midway between the power source voltage Vcc (e.g., circuit operation potential of 5 V) and a reference voltage Vss (ground potential, 0 V, of the circuit). The word lines WL are connected to an X decoder circuit XDec.

On a side of the memory cell array MA is provided a dummy memory cell array DMA in which are arranged many dummy memory cells DM. The dummy cells are separately connected to the pair of data lines $DL_1$ and $\overline{DL_1}$, and are arranged at portions where the pair of data lines DL and dummy word lines DWL intersect each other just like the case of memory cells M. The dummy memory cell DM is constituted by a dummy memory cell select MISFET which is constituted by an n-channel.

In the ½ Vcc plate system in which the power source voltage ½ Vcc is applied to the other electrode of the capacity element for storing data in the memory cell M, the dummy memory cell DM is not substantially required. Further, the dummy memory cell DM is often used for cancelling the coupling noise between the word line WL and the data line DL.

The pair of data lines DL are connected to a data line precharge circuit BP, a sense amplifier SA and an input/output select circuit I/O.

The data line precharge circuit BP is constituted by two precharge MISFET's Qx of which the gate electrodes are connected to the precharge signal line $\phi p$, and a short-circuit MISFET $Q_{SH}$ of which the gate electrode is connected to the precharge signal line $\phi p$. The MISFET Qx has one semiconductor region which is connected to the data line DL and has another semiconductor region which is connected to the reset signal line (reference potential Vss) $\phi_R$. The two semiconductor regions of MISFET $Q_{SH}$ are connected to the data lines DL. The MISFET's Qx and the MISFET $Q_{SH}$ are each constituted by the n-channel.

The sense amplifier circuit SA is constituted by two n-channel MISFET's Qn or two p-channel MISFET's Qp. The semiconductor regions on the side of MISFET's Qn in the sense amplifier circuit SA are connected to the data lines DL, and the semiconductor regions on the other side are connected to the reset signal line (which also serves as a common source line) $\phi_R$. The gate electrodes of MISFET's Qn intersect each other, and are, respectively, connected to the other data lines DL different from the data lines DL to which the semiconductor regions of one side are connected. The semiconductor regions of one side of MISFET's Qp in the sense amplifier circuit SA are connected to the data lines DL, and the semiconductor regions of the other side are connected to the common source line (power source voltage Vcc) $\phi S$. The gate electrodes of MISFET's Qp intersect each other, and are, respectively, connected to the other data lines DL different from the data lines DL to which the semiconductor regions of one side are connected.

The input/output select circuit I/O is constituted by n-channel Y-switch MISFET's $Q_Y$ which have semiconductor regions of one side connected to the data lines DL and have semiconductor regions of the other side connected to input/output signal lines $I/O_1$ and $I/O_2$, respectively. A Y-select signal line YSL is connected to the gate electrodes of the Y-switch MISFET's $Q_Y$. The Y-select signal line YSL is connected to the Y-decoder circuit YDec.

Figure 2:
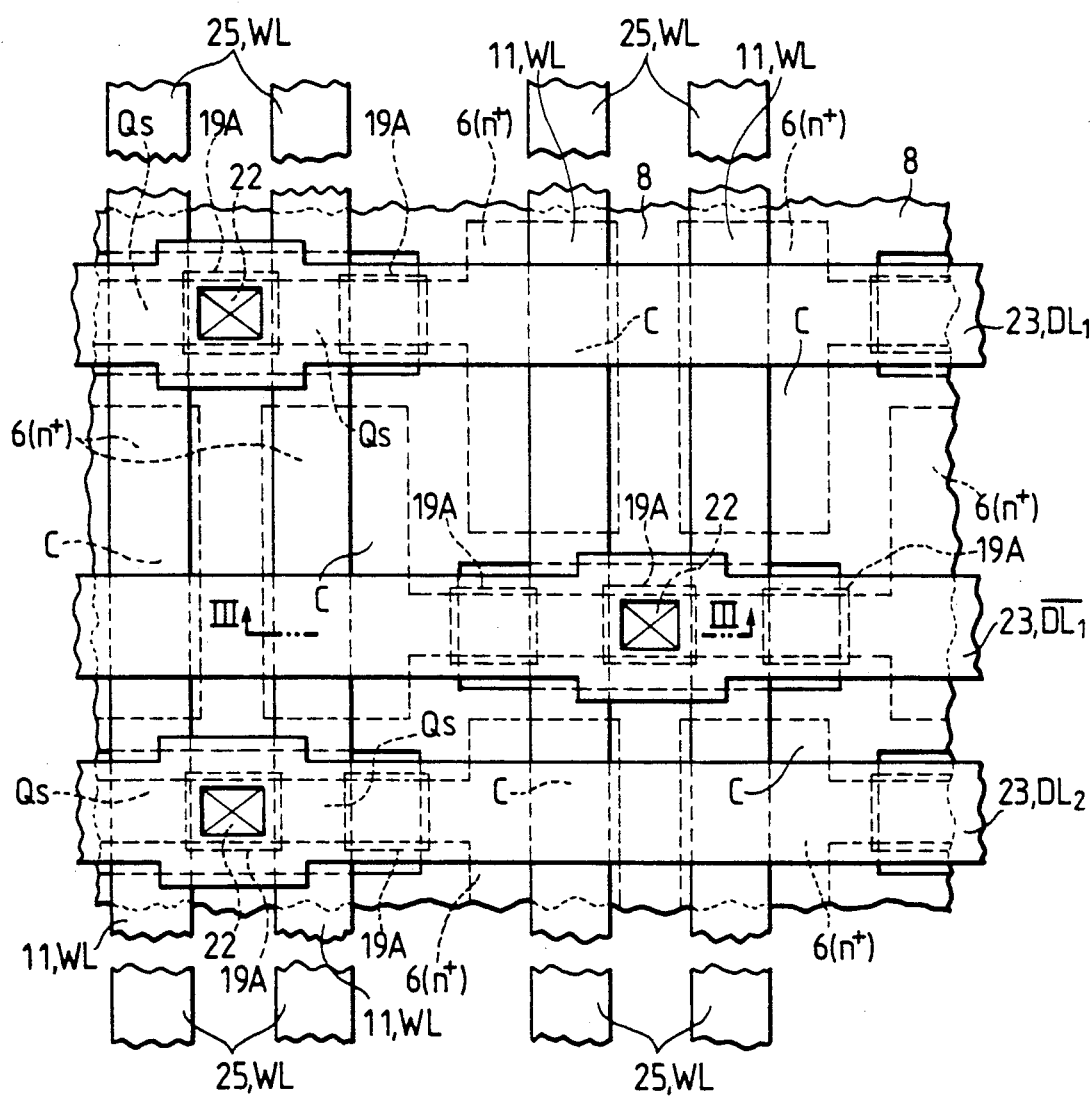
FIG. 2 is a plan view showing major portions of memory cells in the DRAM.
Figure 3:
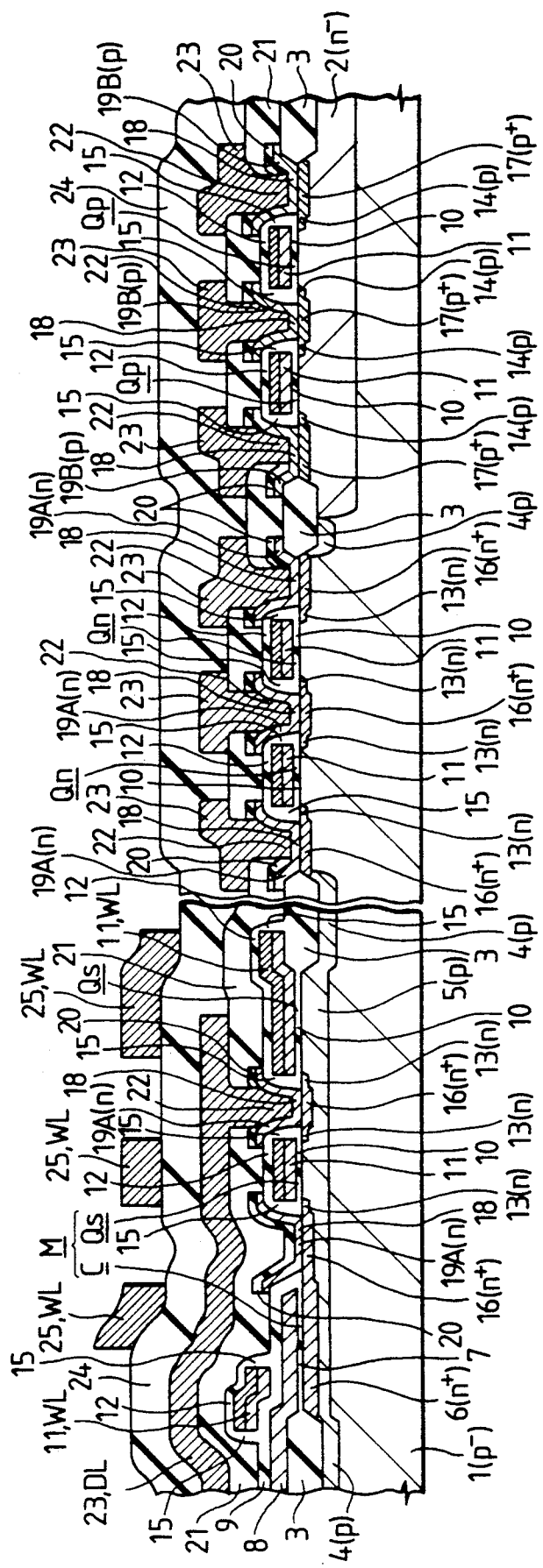

The structure of the DRAM will now be concretely described in conjunction with FIG. 2 (plan view illustrating major portions) and FIG. 3 (section view illustrating major portions). FIG. 2 is a plan view of a memory cell array portion in the DRAM. The left half of FIG. 3 is a section view illustrating major portions of the memory cell array portion, i.e., a section view along III—III in FIG. 2. The right half of FIG. 3 illustrates n-channel MISFET's Qn and p-channel MISFET's Qp that constitute a periphery circuit of the DRAM.

Referring to FIG. 3, the semiconductor integrated circuit device having DRAM is constituted by a p$^-$-type semiconductor substrate 1 composed of a single crystalline silicon.

A memory cell M is constituted by a series circuit of a memory cell select MISFET Qs and a capacitor element C for storing data. The memory cell M is formed on the main surface of the semiconductor substrate 1 (in practice, a p-type semiconductor region 5) in a region specified by a field insulating film 3 and a p-type channel stopper region 4.

The capacitor element C for storing data in the memory cell M is constituted by successively laminating an n$^+$-type semiconductor region (lower electrode) 6, a dielectric film 7 and a plate electrode (upper electrode) 8. That is, the capacitor element C for storing data has the planar structure.

The n$^+$-type semiconductor region 6 is formed on the main surface of the p-type semiconductor region 5 that is formed on the main surface of the semiconductor substrate 1. The p-type semiconductor region 5 has an impurity concentration greater than that of the semiconductor substrate 1 to increase the pn junction capacitor relative to the n$^+$-type semiconductor region 6 and to increase the charge storage capacitance of the capacitor element C that stores data. Further, the p-type semiconductor region 5 constitutes a potential barrier region against minority carriers that generate in the semiconductor substrate 1 upon incidence of α-rays. The p-type semiconductor region 5 is formed by diffusing in the lateral direction the p-type impurities that form the channel stopper region 4. The p-type semiconductor region 5 is formed substantially on the whole surface of the memory cell array. The p-type semiconductor region 5, furthermore, is formed by introducing p-type impurities into the main surface of the semiconductor substrate 1 in a step separate from the step of forming the channel stopper region 4.

The dielectric film 7 is formed on the main surface of the n$^+$-type semiconductor region 6. The dielectric film 7 consists of a single layer such as of a silicon oxide film or a silicon nitride film, or consists of a composite film obtained by superposing them.

The plate electrode 8 is formed on the dielectric film 7 and on the field insulating film 3, i.e., formed on the whole surface of the memory cell array other than the region where memory cell select MISFET's Qs are formed. The plate electrode 8 is composed of a polycrystalline silicon film deposited, for example, by the CVD method. N-type impurities (P or As ions) are introduced into the polycrystalline silicon film to decrease the resistance. The plate 8 is formed by a step of forming a gate wiring of the first layer.

The memory cell select MISFET Qs is constituted by p-type semiconductor region 5, gate insulating film 10, gate electrode 11, a pair of n-type semiconductor regions 13 and a pair of n$^+$-type semiconductor regions 16 that serve as source regions or drain regions.

The p-type semiconductor region 5 is used as the channel-forming region.

The gate insulating film 10 is formed on the main surface of the p-type semiconductor region 5, and is composed of a silicon oxide film that is obtained, for example, by thermally oxidizing the main surface of the p-type semiconductor region 5.

The gate electrode 11 is formed on the gate insulating film 10, and consists of a composite film obtained by stacking a high-melting metal silicide (WSi$_2$, MoSi$_2$, TaSi$_2$, TiSi$_2$) film on the polycrystalline silicon film. The gate electrode, however, is in no way limited to the above composite film only. For instance, the gate electrode 11 may be a single layer of polycrystalline silicon film, a high-melting metal silicide film or a high-melting metal (W, Mo, Ta, Ti) film, or may be a composite film obtained by stacking a high-melting metal film on the polycrystalline silicon film. The gate electrode 11 is formed together with the word line (WL) 11 as a unitary structure in the direction of gate width. The word line 11 extends on the field insulating film 3 and on the plate electrode 8. The word line 11 and the plate electrode 8 are electrically isolated from each other by the interlayer insulating film 9. The gate electrode 11 and the word line 11 are formed by a step of forming a gate wiring of the second layer.

The n-type semiconductor region 13 of a low impurity concentration is formed together with the n$^+$-type semiconductor region 16 of a high impurity concentration as a unitary structure in the source or drain region on the side of the channel-forming region. In the n-type semiconductor region 13 is formed a memory cell select MISFET Qs of the LDD structure. The n-type semiconductor region 13 is formed being self-aligned to the gate electrode 11. The n$^+$-type semiconductor region 16 of a high impurity concentration is formed being self-aligned to the gate electrode 11 with a side wall spacer 15 being interposed therebetween. That is, the n$^+$-type semiconductor region 16 is self-aligned to the gate electrode 11 and the side wall spacer 15. One n$^+$-type semiconductor region 16 between the pair of n$^+$-type semiconductor regions 16 is connected to the n$^+$-type semiconductor region (lower electrode) 6 of the capacitor element C that tores the data. The side wall spacer 15 is self-aligned to the side wall of the gate electrode 11.

A complementary data line (DL) 23 is electrically connected via an intermediate electrically conductive film 19A to the other n-type semiconductor region 16 of the memory cell select MISFET Qs in the memory cell M constituted as described above. The other n$^+$-type semiconductor region 16 is formed together with (or shares) the other n$^+$-type semiconductor region 16 of memory cell select MISFET Qs in the other memory cell M that is adjacent thereto in the direction in which the complementary data line 23 extends.

One end of the intermediate electrically conductive film 19A is connected to the other n$^+$-type semiconductor region 16 via a connection hole 18 in a region specified by the side wall spacer 15 which is self-aligned to the gate electrode 11 of the memory cell select MISFET Qs. Therefore, the connection hole 18 and the intermediate electrically conductive film 19A are self-aligned to the gate electrode 11. The end of the intermediate electrically conductive film 19A extends onto the gate electrode 11 along the side wall spacer 15. The intermediate electrically conductive film 19A and the gate electrode 11 are electrically isolated from each other by the interlayer insulating film 12. The intermediate electrically conductive film 19A is formed by depositing by the CVD method a polycrystalline silicon film to which no n-type impurity (P or As) is introduced to decrease the resistance or to which such impurities are introduced at a low concentration and, then, by introducing n-type impurities into the polycrystalline silicon film. The polycrystalline silicon film has a thickness of, for example, about 1000 to 2000 angstroms. The n-type impurities are introduced into the polycrystalline silicon film from the n-type semiconductor region 16 (from the substrate side). That is, the intermediate electrically conductive film 19A is formed maintaining a size determined by the amount of n-type impurities that are diffused, without developing any masking deviation in the step for forming the gate electrode 11. A mask 20 formed on the intermediate electrically conductive film 19A maintaining the same pattern so works that the intermediate electrically conductive film 19A is patterned being self-aligned to the gate electrode 11. The mask 20 is composed of a silicon oxide film formed by thermally oxidizing the surface of the polycrystalline silicon film which is, for example, the intermediate electrically conductive film 19A. The intermediate electrically conductive film 19A is formed by a step of forming a gate wiring of the third layer.

The complementary data line 23 is formed on the interlayer insulating film 21 so as to be connected to the surface of the intermediate electrically conductive film 19A via a connection hole 22 formed in the interlayer insulating film 21 and the mask 20. The complementary data 23 is chiefly composed of aluminum in order to increase the speed for writing data and reading data. That is, the complementary data line 23 is composed, for example, of an aluminum film to which Si and/or Cu are added, or of a composite film obtained by laminating an aluminum film on a high-melting metal film. The complementary data line 23 is formed by the step of forming a wiring of the first layer.

A shunting word line (WL) 25 is formed on the complementary data line 23 via an interlayer insulating film 24. Though not diagramed, the shunting word line 25 is electrically connected to the word line 11 via the intermediate electrically conductive film formed in the step of forming the wiring of the first layer. The shunting word line 25 works to decrease the resistivity of the word line 11 and to increase the speed for writing and reading the data. The shunting word line 25 is formed by a step of forming the wiring of the second layer.

The n-channel MISFET Qn in the peripheral circuit is formed on the main surface of the semiconductor substrate 1 in the region specified by the field insulating film 3 and the channel stopper region 4. That is, the n-channel MISFET Qn is constituted by semiconductor substrate 1, gate insulating film 10, gate electrode 11, a pair of n-type semiconductor regions 13 and a pair of n+-type semiconductor regions 16 which are the source regions and drain regions. The n-channel MISFET Qn has the LDD structure which is substantially the same as the memory cell select MISFET Qs. Further, the n+-type semiconductor regions 16 are formed as a unitary structure (sharing structure) on one side of the n-channel MISFET's Qn that are neighboring to each other in the lengthwise direction of gate.

The wiring 23 is connected via the intermediate electrically conductive film 19A to the n+-type semiconductor region 16 of the thus constituted n-channel MISFET Qn. The intermediate electrically conductive film 19A is constituted by a polycrystalline silicon film to which n-type impurities are introduced like the intermediate electrically conductive film 19A connected to the other n+-type semiconductor region 16 of the memory cell select MISFET Qs. The wiring 23 is formed by the step of forming the complementary data line 23. However, the wiring for the peripheral circuit may be the one of the layer same as the shunting word line 25, or may be comprised of the two.

The p-channel MISFET Qp in the peripheral circuit is formed on the main surface of the n−-type well region 2 in the region specified by the field insulating film 3. The n−-type well region 2 is formed on the main surface of the semiconductor substrate 1 in the region where the p-channel MISFET Qp is formed. The p-channel MISFET Qp is constituted chiefly by n−-type well region 2 (channel-forming region), gate insulating film 10, gate electrode 11, a pair of p-type semiconductor regions 14 and a pair of p+-type semiconductor regions 17 that are the source regions and drain regions. The p-channel MISFET Qp has the LDD structure like the memory cell select MISFET Qs and the n-channel MISFET Qn. Further, the p+-type semiconductor regions 17 are formed as a unitary structure (sharing structure) on one side of the p-channel MISFET's Qp that are neighboring to each other in the lengthwise direction of gate.

The wiring 23 is connected via the intermediate electrically conductive film 19B to the p+-type semiconductor region 17 of the thus constituted p-channel MISFET Qp. The intermediate electrically conductive film 19B consists of a polycrystalline silicon film to which p-type impurities ($BF_2$ or B ions) are introduced unlike the intermediate electrically conductive film 19A that is connected to the n+-type semiconductor regions 16 of the memory cell select MISFET Qs and the n-channel MISFET Qn. The intermediate electrically conductive film 19B has fundamentally the same structure as the intermediate electrically conductive film 19A but is different from the intermediate electrically conductive film 19A only with respect to the conductivity type of the impurities that are introduced. The wiring 23 is formed in the step of forming the complementary data line 23.

The method of fabricating the thus constituted semiconductor integrated circuit device will now be described briefly in conjunction with FIGS. 4 to 13 (section views illustrating major portions in each of the fabrication steps).

First, there is prepared a p−-type semiconductor substrate 1 having a resistivity of 8 to 12 ohms·cm which is composed of single crystalline silicon.

Next, an n−-type well region 2 is formed on the main surface of the semiconductor substrate 1 by implanting phosphorus ions at a concentration of $1 \times 10^{12}$ to $1 \times 10^{13}$ atoms/cm$^2$ at 100 to 150 keV followed by the heat treatment at 1000° to 1200° C. in the region where the p-channel MISFET Qp is to be formed.

Figure 4:
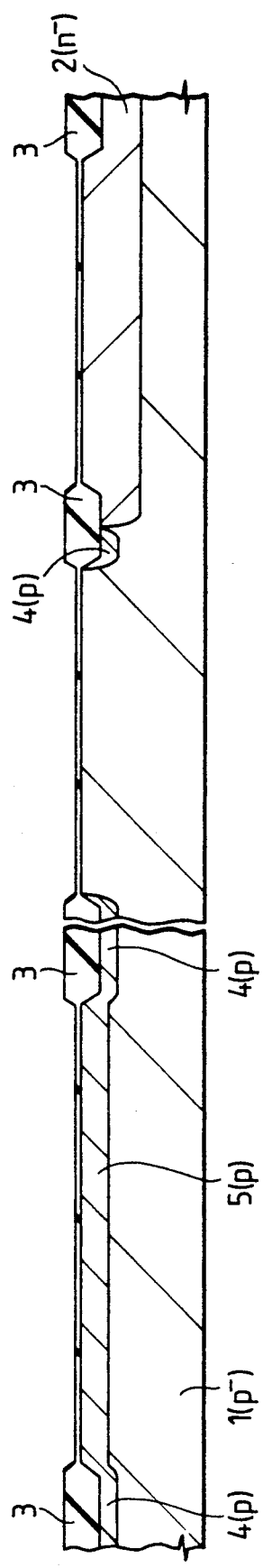

Then as shown in FIG. 4, a field insulating film 3 is formed maintaining a thickness of 5000 to 6000 angstroms on the main surface of the semiconductor substrate 1 and on the main surface of the well region 2 between the regions where the semiconductor elements are to be formed. A p-channel stopper region 4 is formed on the main surface of the semiconductor substrate 1 under the field insulating film 3 in a step which is nearly the same as the step for forming the field insulating film 3. The p-channel stopper region is formed by implanting ions of $BF_2$ at a concentration of 2 to $3 \times 10^{13}$ atoms/cm$^2$ and at 40 keV. In the region for forming a memory cell array, furthermore, a p-type semiconductor region 5 is formed on the main surface of the semiconductor substrate 1 in the step of forming the channel stopper region 4 or in a step before or after the above step. The p-type semiconductor region 5 is formed on the whole surface of the memory cell array-forming region. When the channel stopper 4 and the p-type semiconductor region 5 are to be formed in the same step in the memory cell array unit, boron ions are implanted therein at a concentration of 2 to $4 \times 10^{12}$ atoms/cm$^2$ and at 200 to 230 keV through the field insulating film 3.

Next, in a region for forming a capacity element C that stores data in a memory cell M, arsenic ions are implanted at a concentration of 2 to $5 \times 10^{14}$ atoms/cm$^2$ and at 110 to 140 keV onto the main surface of the p-type semiconductor region 5, in order to form an n$^+$-type semiconductor region 6.

Figure 5:
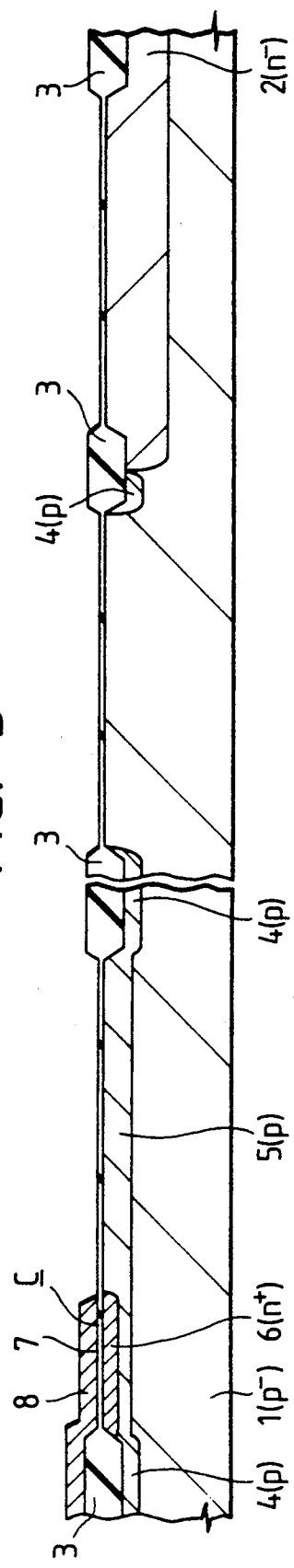

Then, a dielectric film 7 consisting of an oxide film of about 80 to 100 angstroms thick is formed the main surface of at least the n$^+$-type semiconductor region 6. In the memory cell array-forming region as shown in FIG. 5, furthermore, a plate electrode 8 consisting of a polycrystalline silicon film having a thickness of 3000 to 4000 angstroms is formed on the dielectric film 7 and on the field insulating film 3 except the region where the memory cell select MISFET's Qs are to be formed. The capacitor element C for storing data constituted by n$^+$-type semiconductor region 6, dielectric film 7 and plate electrode 8, is completed through the step of forming the plate electrode 8.

An intermediate insulating film 9 is formed maintaining a thickness of about 3000 angstroms to cover the surface of the plate electrode 8 in an oxygen atmosphere heated at 800° to 900° C. At this moment, an oxide film having a thickness of about 350 angstroms is formed on the main surface of p-type semiconductor region 5, semiconductor substrate 1 and well region 2 in the MISFET-forming region. However, a gate insulating film 10 is formed by removing this oxide film, and oxidizing the surface of the semiconductor substrate to newly form an oxide film having a thickness of about 200 to 250 angstroms.

With reference to FIG. 6, a gate electrode 11 is formed on the gate insulating film 10, and word lines (WL) 11 are formed on the field insulating film 3 and on the interlayer insulating film 9 in the memory cell array-forming region. The gate electrode 11 and the word line 11 consist of composite films obtained by laminating a high-melting metal silicide film 11B on the polycrystalline silicon film 11A. The polycrystalline silicon film 11A is deposited, for example, by the CVD method maintaining a thickness of about 2000 to 3000 angstroms. Into the polycrystalline silicon film 11A are introduced, for example, n-type impurities (P, As ions or p-type impurities: B ions). The n-type impurities work to decrease the resistivity of the polycrystalline silicon film 11A. The high-melting metal silicide film 11B is deposited, for example, by the sputtering method and has a thickness of about 1000 to 3000 angstroms. An interlayer insulating film 12 is formed on the high-melting metal silicide film 11B. The interlayer insulating film 12 consists of a silicon oxide film that is deposited, for example, by the CVD method, and has a thickness of about 2000 to 4000 angstroms. The gate electrode 11 and the interlayer insulating film 12 are formed by the patterning (stack cutting) in the same step based on the anisotropic etching such as RIE.

Then, n-type impurities 13A are introduced into the main surface of the p-type semiconductor region 5 and into the main surface of the semiconductor substrate 1 in the memory cell array-forming region and in the n-channel MISFET Qn-forming region. The n-type impurities 13A consist of, for example, phosphorus ions of a concentration of $1 \times 10^{13}$ atoms/cm$^2$ and ar implanted with the energy of about 60 to 90 keV. The plate electrode 8, gate electrode 11 (and/or interlayer insulating film 12), and field insulating film 3 are used as masks and, hence, the n-type impurities 13A are introduced being self-aligned thereto.

With reference to FIG. 7, p-type impurities 14A are introduced into the main surface of the well region 2 in the region where the p-channel MISFET Qp is formed. The p-type impurities 14A consist of $BF_2$ ions of a concentration of about $1 \times 10^{13}$ to $4 \times 10^{13}$ atoms/cm$^2$, and are implanted with the energy of about 70 to 90 keV. Since the gate electrode 11 (and/or interlayer insulating film 12), and field insulating film 3 are used as masks, the p-type impurities 14A are introduced being self-aligned thereto.

Side wall spacers 15 are formed on the side walls of the gate electrode 11 (inclusive of word line 11). The side wall spacers 15 are formed by depositing a silicon oxide film having a thickness of about 4000 to 5000 angstroms by the CVD method on the whole surface of the substrate including the interlayer insulating film 12, and subjecting the silicon oxide film to the anisotropic etching such as RIE. Therefore, the side wall spacers 15 are formed on the side walls of the gate electrode 11 being self-aligned thereto. The side wall spacers 15 have a thickness of 0.25 to 0.3 $\mu$m at the bottom portion thereof.

Next, n-type impurities 16A are introduced into the main surfaces of the p-type semiconductor region 5 and the semiconductor substrate 1 in the memory cell array-forming region and in the region for forming n-channel MISFET's Qn in the peripheral circuit region. The n-type impurities consist of, for example, arsenic ions of a concentration of about $10^{15}$ to $10^{16}$ atoms/cm$^2$ and are implanted with the energy of about 70 to 90 keV. Since the side wall spacers 15 are used as a mask, the in-type impurities 16A are introduced being self-aligned thereto.

Figure 8:
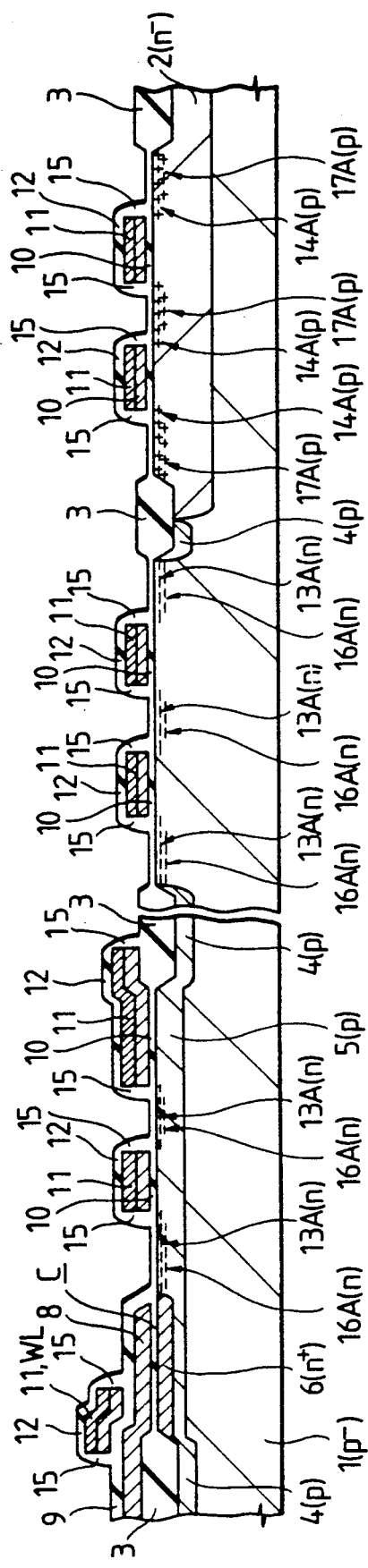

With reference to FIG. 8, p-type impurities 17A are introduced into the main surface of the well region 2 in the region for forming p-channel MISFET's Qp. The p-type impurities 17A consist, for example, of $BF_2$ ions of a concentration of about $10^{15}$ to $10^{16}$ atoms/cm$^2$ and are implanted with the energy of about 70 to 90 keV. Since the side wall spacers 15 are used as masks, the p-type impurities 17A are introduced being self-aligned thereto.

Next, the insulating film is removed from the p-type semiconductor region 5, semiconductor substrate 1 and well region 2, and a connection hole 18 is formed in the region (e.g., between the gate electrodes 11 that are neighboring to each other in the lengthwise direction of gate) in a region specified by the side wall spacers 15. The connection hole 18 can be formed by etching using the side wall spacers 15 as a mask. Main surfaces of the p-type semiconductor region 5, semiconductor substrate 1 and well region 2 are exposed in the connection hole 18.

Figure 9:
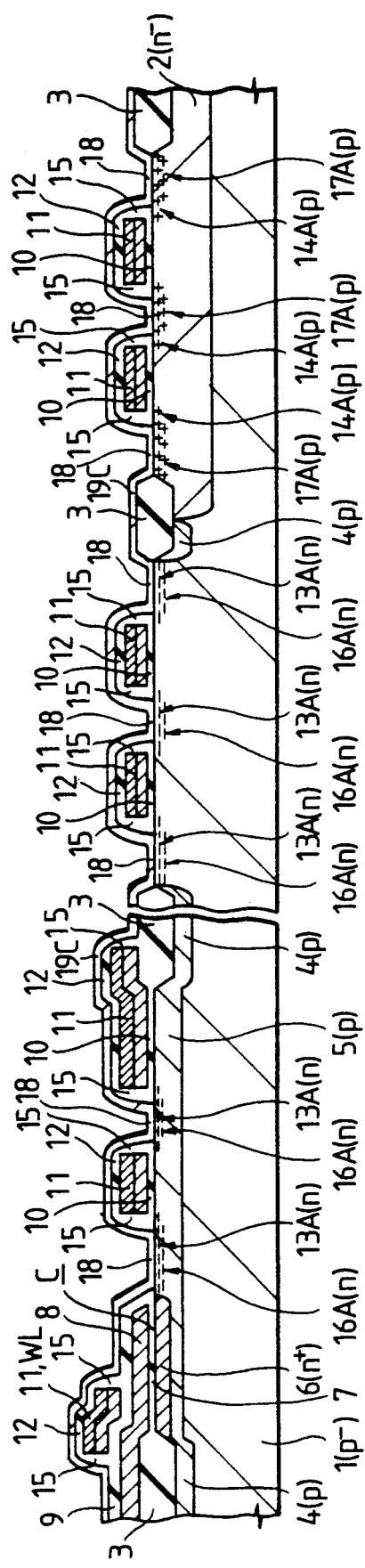

With reference to FIG. 9, a silicon film 19C is formed on the whole surface of the substrate inclusive of the interlayer insulating film 12 and the side wall spacers 15 so as to come into contact with the main surfaces of the p-type semiconductor region 5, semiconductor substrate 1, and well region 2 through the connection hole 18. The silicon film 19C consists of a polycrystalline silicon film deposited, for example, by the CVD method and has a thickness of about 1000 to 2000 angstroms. Into the polycrystalline silicon film have not been introduced the impurities for controlling the resistance or have been introduced the impurities at a low concentration. The silicon film 19C may be a single crystalline silicon film or a non-crystalline silicon film, or may be any other metal film whose resistance can be controlled by introducing impurities.

Figure 10:
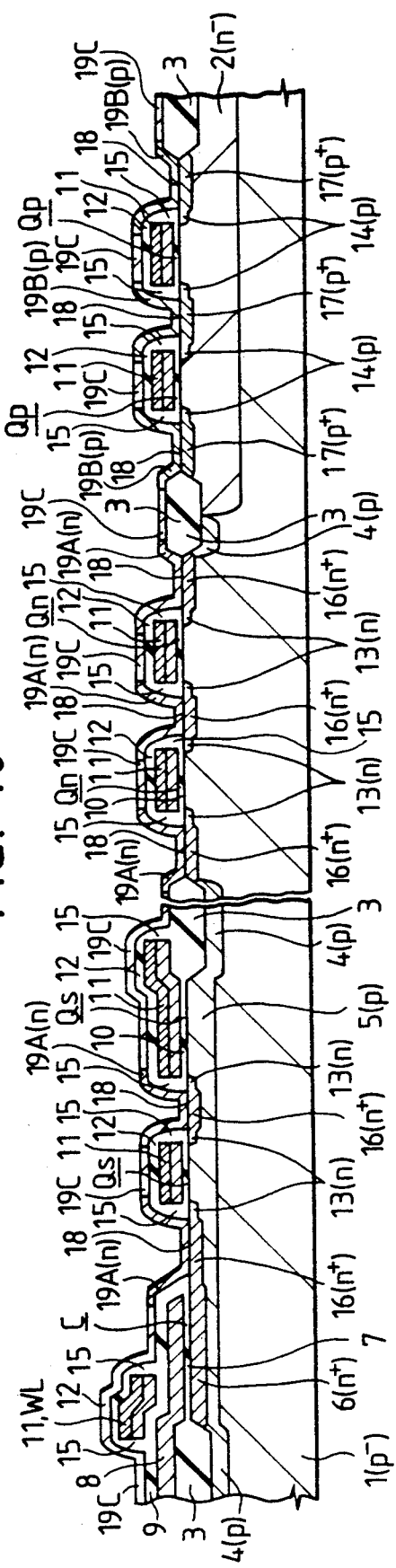

With reference to FIG. 10, the whole surface of the substrate is heat-treated (annealed). Owing to the heat treatment, the n-type impurities 13A and n-type impurities 16A are spread and diffused thereby to form an n-type semiconductor region 13 and an n+-type semiconductor region 16. Furthermore, the p-type impurities 14A and p-type impurities 17A are spread and diffused thereby to form a p-type semiconductor region 14 and a p+-type semiconductor region 17. In the step of forming these semiconductor regions 13, 16, 14 and 17, furthermore, n-type impurities 13A and 16A are diffused into the silicon film 19C in contact with the n+-type semiconductor region 16, whereby an n-type intermediate electrically conductive film 19A is formed. Furthermore, p-type impurities 14A and 17A are diffused into the silicon film 19C in contact with the p+-type semiconductor region 17, and a p-type intermediate electrically conductive film 19B is formed. That is, the n-type intermediate electrically conductive film 19A is formed by diffusing n-type impurities 13A, 16A into the silicon film 19C, the n-type impurities 13A, 16A being used for forming the n-type semiconductor region 13 and the n+-type semiconductor region 16. Furthermore, the p-type intermediate electrically conductive film 19B is formed by diffusing p-type impurities 14A and 17A into the silicon film 19C, the p-type impurities 14A and 17A being used for forming p-type semiconductor region 14 and p+-type semiconductor region 17. The heat treatment is effected, for example, in a nitrogen gas atmosphere at a temperature of about 900° to 1000° C. for about 10 to 20 minutes. Under such conditions, the n+-type semiconductor region 16 is formed to have a pn junction depth (xj) of about 0.2 $\mu$m and the p+-type semiconductor region 17 is formed to have a pn junction depth (xj) of about 0.2 to 0.3 $\mu$m. The size of the n-type intermediate electrically conductive film 19A is specified by the amount of n-type impurities 13A and 16A that are diffused, and the size of the p-type intermediate electrically conductive film 19B is specified by the amount of p-type impurities 14A and 17A that are diffused. The silicon film 19C is left except the regions where the n-type intermediate electrically conductive film 19A and the p-type intermediate electrically conductive film 19B are formed. By forming the n-type semiconductor region 13 and the n+-type semiconductor region 16, the memory cell select MISFET Qs and the n-channel MISFET Qn are completed. By forming the p-type semiconductor region 14 and the p+-type semiconductor region 17, furthermore, the p-channel MISFET Qp is completed.

Figure 11:
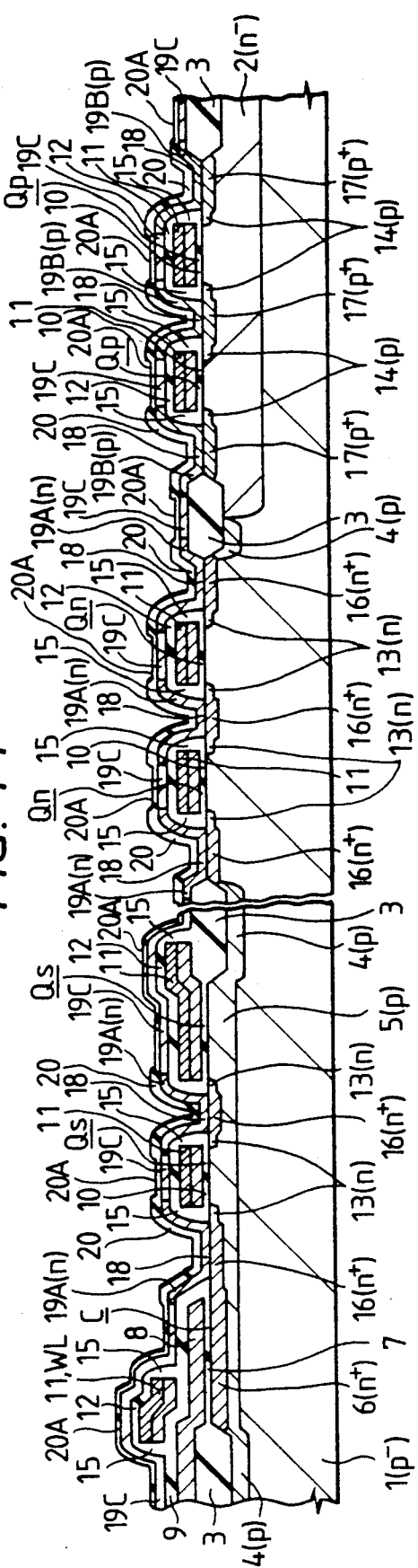

With reference to FIG. 11, the whole surface of the substrate is thermally oxidized at 800° to 900° C., a mask 20 is formed maintaining a thickness of about 3000 angstroms on the surfaces of the n-type intermediate electrically conductive film 19A and p-type intermediate electrically conductive film 19B, and a mask 20A is formed maintaining a thickness of 300 to 350 angstroms on the surface of the silicon film 19C. The mask 20 consists of a silicon oxide film formed by thermally oxidizing the surfaces of the n-type intermediate electrically conductive film 19A and the p-type intermediate electrically conductive film 19B. The silicon oxide film contains impurities at a high concentration and is formed by the breeding oxidation maintaining a thickness greater than that of the mask (silicon oxide film) 20A formed on the surface of the silicon film 19C. That is, the mask 20 is formed on the surface of the n-type intermediate electrically conductive film 19A and the p-type intermediate electrically conductive film 19B in a self-aligned manner.

Figure 12:
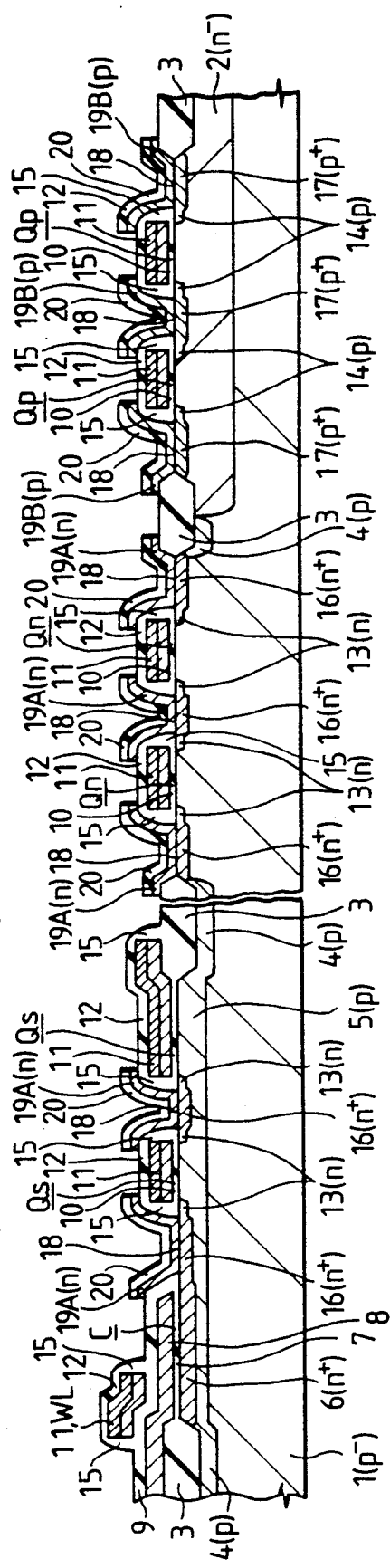

Then, the surfaces of the masks 20 and 20A are subjected to the etching to such a degree that the mask 20A is removed. Using the mask 20, the silicon film 19C is removed from other regions by the reactive ion etching with, for example, a $CCl_4$ gas. Thus, the n-type intermediate electrically conductive film 19A and the p-type intermediate electrically conductive film 19B that are patterned are completed as shown in FIG. 12. Here, resistances of the intermediate electrically conductive films 19A and 19B can be further decreased. That is, after patterning, P or As ions are implanted into the n-type intermediate electrically conductive film 19A, and B or $BF_2$ ions are implanted into the p-type intermediate electrically conductive film 19B, followed by annealing in order to decrease the resistance. In this case, the pn junction is deepened to some extent between the source and drain regions but is prevented from extending since the concentration of impurities decreases as they diffuse into the intermediate electrically conductive films 19A and 19B. The n-type intermediate electrically conductive film 19A and the p-type intermediate electrically conductive film 19B have sizes specified by the amount of impurities that are diffused and are, hence, formed being self-aligned to the gate electrode 11. There exists an etching solution for selectively etching the polycrystalline silicon film utilizing the difference in concentration of p-type impurities but there does not exist any etching solution for selectively etching the polycrystalline silicon film based on the difference in concentration of n-type impurities. Therefore, the etching method of the present invention is advantageous from the standpoint of forming the n-type intermediate electrically conductive film 19A in a self-aligned manner. The mask 20 may be removed but is left in this embodiment such that the number of fabrication steps does not increase.

Figure 13:
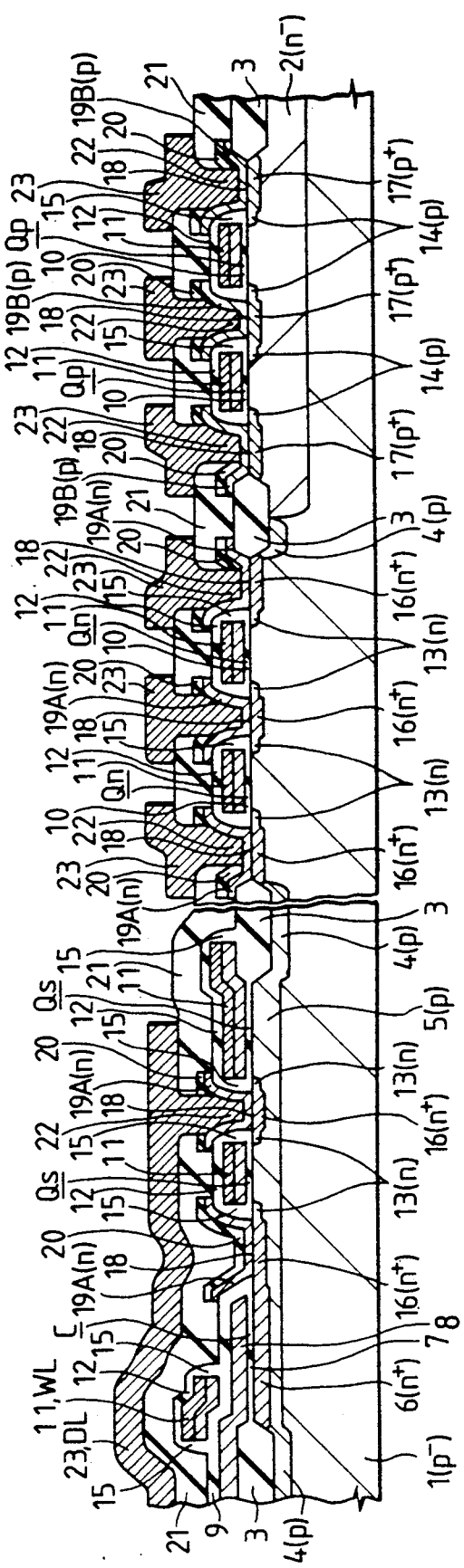

An interlayer insulating film 21 is formed on the whole surface of the substrate inclusive of the mask 20. The interlayer insulating film consists of an oxide film of the lower layer having a thickness of about 2000 angstroms formed by the CVD method and a BPSG film having a thickness of 5000 to 7000 angstroms formed by the CVD method. The mask 20 and the interlayer insulating film 21 are removed from the predetermined n-type intermediate electrically conductive film 19A and the p-type intermediate electrically conductive film 19B, and a connection hole 22 is formed. With reference to FIG. 13, a complementary data line (DL) 23 and a wiring 23 are formed on the interlayer insulating film 21 so as to be connected to the predetermined n-type intermediate electrically conductive film 19A and the p-type intermediate electrically conductive film 19B through the connection hole 22. Here, the wiring 23 is composed of aluminum which contains silicon and copper, and has a thickness of about 5000 angstroms. Further, the wiring 23 may have a laminated layer structure such as of MoSi$_2$/Al-Si-Cu/MoSi$_2$. In this case, the lower MoSi$_2$ layer has a thickness of 100 to 600 angstroms, the Al-Si-Cu layer has a thickness of about 5000 angstroms, and the upper MoSi$_2$ layer has a thickness of about 200 angstroms.

An interlayer insulating film 24 is formed on the whole surface of the substrate inclusive of complementary data line 23 and wiring 23, and then a shunting word line (WL) 25 is formed on the interlayer insulating film 24 as shown in FIG. 1. The interlayer insulating film has a three layer structure consisting of, for example, a lower P-SiO layer, a middle SOG layer and an upper P-SiO layer, and has the total film thickness of about 1 μm. The lower P-SiO layer is 2000 angstroms thick and the upper P-SiO layer is about 6000 angstroms thick. The shunting word line 24 has the same structure as the wiring 23. Thereafter, the final passivation film that is not shown is formed on the whole surface of the substrate.

The semiconductor integrated circuit device according to this embodiment is completed through these series of fabrication steps.

In the semiconductor integrated circuit device in which the wiring 23 is connected to the semiconductor region 16 of the MISFET Qs via the intermediate electrically conductive film 19A, the n-type impurities 16A (and/or 13A) for forming the semiconductor region 16 are introduced into the substrate to form a silicon film 19C, the n-type impurities 16A are spread and diffused to form a semiconductor region 16 in the substrate, and the n-type of impurities 16A are diffused in the silicon film 19C to form the intermediate electrically conductive film 19A. That is, the semiconductor region 16 of the MISFET Qs is formed by introducing impurities only one time, by spreading and diffusing impurities only one time, and by effecting the heat treatment only one time. Therefore, the pn junction of the semiconductor region 16 is shallowed, the short channel effect is prevented from taking place, and the intermediate electrically conductive film 19A is permitted to possess electric conductivity, enabling the semiconductor region 16 to become electrically conductive to the wiring 23. The short channel effect is prevented from taking place in the MISFET Qs by decreasing the gate length and reducing the area occupied by the MISFET Qs, thereby contributing to increasing the integration degree of the semiconductor integrated circuit device. The same effects are also obtained for the n-channel MISFET Qn and the p-channel MISFET Qp.

In the semiconductor integrated circuit device (having CMOS) in which the wirings 23 are connected to the n$^+$-type semiconductor substrate 16 of the n-channel MISFET Qn (and/or Qs) via the intermediate electrically conductive film 19A and to the p$^+$-type semiconductor region 17 of the p-channel MISFET Qp via the intermediate electrically conductive film 19B, furthermore, n-type impurities 16A for forming the n$^+$-type semiconductor region 16 and p-type impurities 17A for forming the p$^+$-type semiconductor region 17 are introduced into the substrate to form a silicon film 19C, the n-type impurities 16A and the p-type impurities 17A are spread and diffused to form an n$^+$-type semiconductor region 16 and a p$^+$-type semiconductor region 17 in the substrate, the n-type impurities 16A are diffused in the silicon film 19C to form an n-type intermediate electrically conductive film 19A, and the p-type impurities 17A are diffused in the silicon film 19C to form the p-type intermediate electrically conductive film 19B. Thus, the n-type intermediate electrically conductive film 19A connected to the n$^+$-type semiconductor region 16 of the complementary MISFET and the p-type intermediate electrically conductive film 19B connected to the p$^+$-type semiconductor region 17 are permitted to possess electric conductivity by utilizing the n-type impurities 16A that form n$^+$-type semiconductor region 16 of the n-channel MISFET Qn and utilizing the p-type impurities 17A that form p$^+$-type semiconductor region 17 of the p-channel MISFET Qp. Therefore, the steps for fabricating the semiconductor integrated circuit device can be decreased by an amount that corresponds to the steps for introducing impurities into the n-type intermediate electrically conductive film 19A and the p-type intermediate electrically conductive film 19B (i.e., decreased by an amount corresponding to the step for forming the mask twice, the step for introducing impurities twice and the step for heat treatment).

Furthermore, the n-type impurities are diffused into the intermediate electrically conductive film 19A and the p-type impurities are introduced into the intermediate electrically conductive film 19B substantially in the same step in which the heat treatment is also effected to form the n$^+$-type semiconductor region 16 and the p$^+$-type semiconductor region 17, making it possible to decrease the number of steps for fabricating the semiconductor integrated circuit device. Furthermore, the time can be shortened for fabricating the semiconductor integrated circuit device.

Furthermore, the mask 20 is selectively formed on the n-type intermediate electrically conductive film 19A in which the n-type impurities 16 are diffused. Using this mask 20, the silicon film 19C is removed to form the n-type intermediate electrically conductive film 19A, and whereby the n-type intermediate electrically conductive film 19A is patterned being self-aligned to the gate electrode 11 of the MISFET Qs maintaining a size specified by the amount of n-type impurities 16A that are diffused. Therefore, the masking deviation is eliminated in the steps of fabrication, and variance decreases in the amount of superposition between the gate electrode 11 of MISFET Qs and the n-type intermediate electrically conductive film 19A. As a result, a high-speed operation is accomplished since variance in the coupling capacitance between the word line (WL) 11 and the complementary data line (DL) 23 decreases for each of the word lines in the DRAM.

As shown in FIG. 3, furthermore, in the memory cell select MISFET Qs in the memory cell M, the n-type intermediate electrically conductive film 19A is also formed on the side connected to the capacitor element C for storing data in the step of forming the n-type intermediate electrically conductive film 19A on the side connected to the complementary data line 23. The n-type intermediate electrically conductive film 19A of the side connected to the capacitor element C that stores data is electrically connected to one n$^+$-type semiconductor region 16 of the memory cell select MISFET Qs. The thus constituted n-type intermediate electrically conductive film 19A forms a coupling capacitance relative to the gate electrode 11 and the plate electrode 8, contributing to increasing the charge storing capacitance of the capacitor element C that stores the data. That is, the n-type intermediate electrically conductive film 19A works to decrease soft error caused by α-rays and enables the integration degree of DRAM to be further increased.

Figure 14:
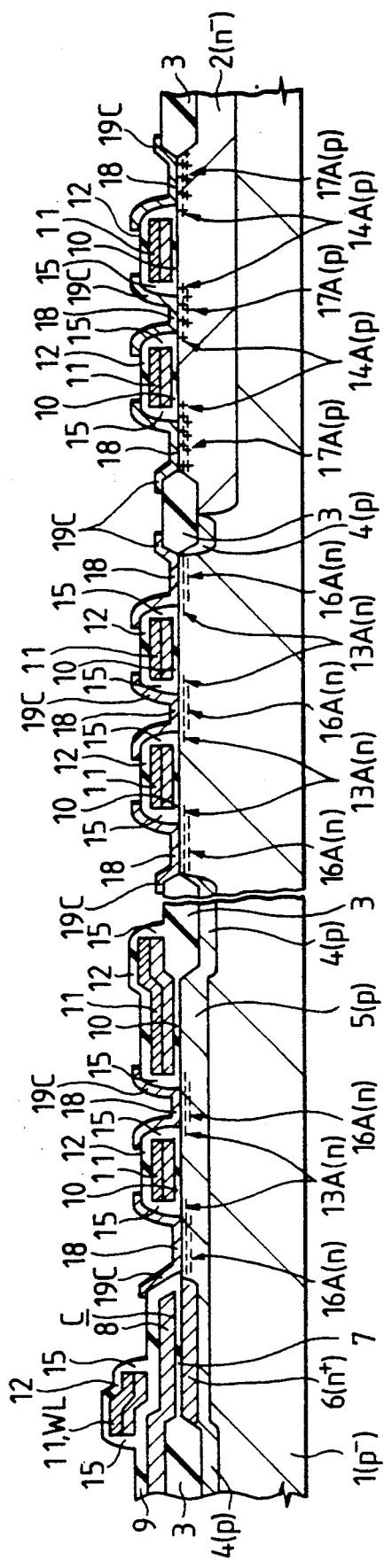
FIGS. 14 and 15 are diagrams illustrating modified examples of the method of forming an intermediate electrically conductive film according to the present invention.

The intermediate electrically conductive film of this embodiment may be formed by the method described below in conjunction with FIGS. 14 and 15.

First, the silicon film 19C is formed on the whole surface of the substrate as shown in FIG. 9, and is then patterned into any desired shape as shown in FIG. 12 using the conventional photolithography technology.

Figure 15:
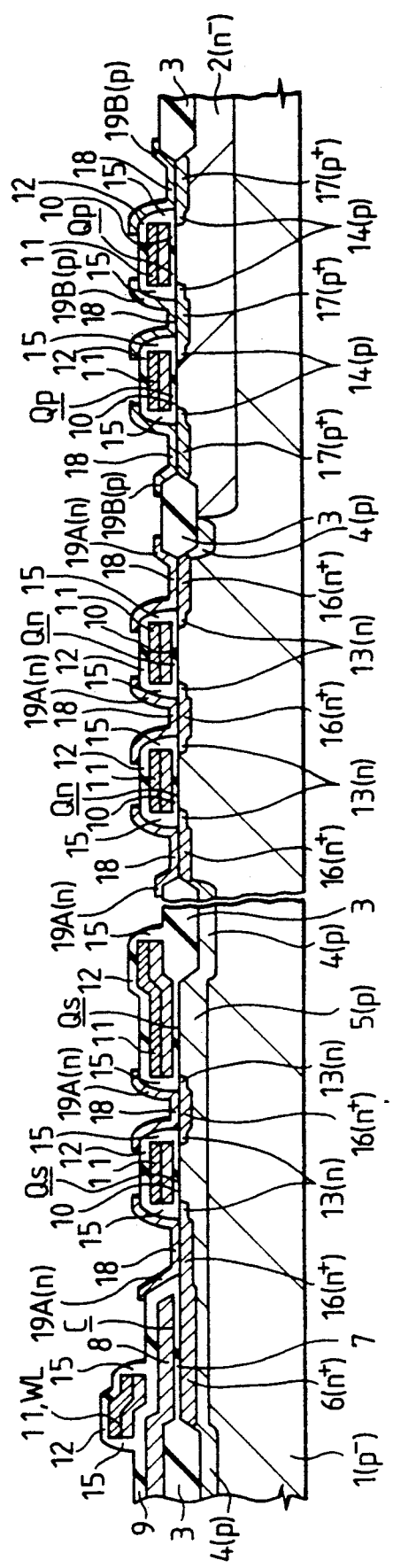

With reference to FIG. 15, the n-type impurities 13A and 16A introduced in the above step are spread and diffused in order to form the n-type semiconductor region 13 and the n+-type semiconductor region 16. Then, the p-type impurities 14A and 17A are spread and diffused in order to form the p-type semiconductor region 14 and the p+-type semiconductor region 17. Through the step of forming the semiconductor regions 13, 16, 14 and 17, the n-type intermediate electrically conductive film 19A and the p-type intermediate electrically conductive film 19B are formed like in the aforementioned embodiment I.

As required, furthermore, n-type and p-type impurities may be implanted into the n-type intermediate electrically conductive film 19A and the p-type intermediate electrically conductive film 19B followed by the heat treatment in order to decrease the resistance of the intermediate electrically conductive films.

According to this method, the pn junction is not deepened between the source region and the drain region of MISFET, and the intermediate electrically conductive films are allowed to possess electric conductivity though the intermediate electrically conductive films are slightly deviated from the gate electrode.

Figure 16:
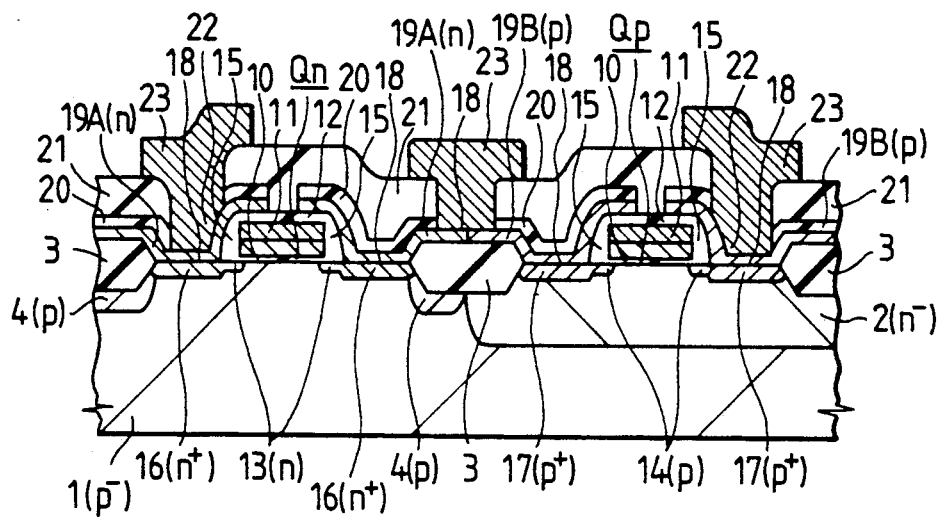
FIGS. 16 and 17 are diagrams illustrating examples in which the present invention is adapted to devices other than the DRAM.

Described below in conjunction with FIG. 16 is the case where the intermediate electrically conductive films of the present invention are used as wirings.

With reference to FIG. 16, an n-type intermediate electrically conductive film 19A and a p-type intermediate electrically conductive film 19B are used as wirings in the semiconductor integrated circuit device. When the signals transmitted to the n-type intermediate electrically conductive film 19A and the p-type intermediate electrically conductive film 19B are to be drawn from one place through the wiring 23, it is desired to so connect the wiring 23 that it covers them.

Figure 17:
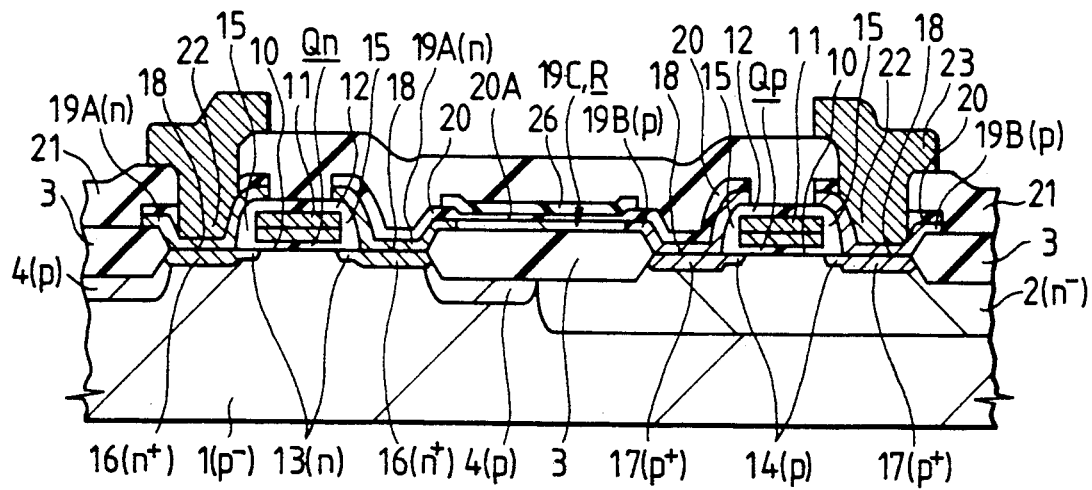

FIG. 17 shows the case where part of the intermediate electrically conductive film is used as a resistance element. In this case, the silicon film 19C is left between the n-type intermediate electrically conductive film 19A and the p-type intermediate electrically conductive film 19B (or between the intermediate electrically conductive films having the same type of conductivity), and is used as a resistance element R. The resistance element R can be formed by forming a mask 26 consisting of, for example, a nitride film on the mask 20A in the region thereof, and leaving the silicon film 19C only on this region at the time of removing the silicon film 19C.

In the example of FIG. 17, in principle, the effects are obtained which are nearly the same as those of the examples of FIGS. 1 to 13. Furthermore, the resistance element R is formed in the same layer as the intermediate electrically conduction films 19A and 19B.

What is claimed is:

1. A method of fabricating semiconductor integrated circuit devices comprising:
   (a) a step for introducing impurities into the main surface of a semiconductor substrate at a location in which a semiconductor region, that serves as a semiconductor region of a semiconductor integrated circuit device, is to be formed;
   (b) a step for forming a silicon film on the main surface of the semiconductor substrate at said location at which said impurities have been introduced; and
   (c) a step for heat-treating the impurities that are introduced to diffuse impurities in the semiconductor substrate in order to form the semiconductor region, and to diffuse impurities in the silicon film so that said silicon film selectively possesses electric conductivity, the heat treatment being performed so that a part of the silicon film does not have impurities diffused thereinto, said part forming a resistance element of a semiconductor integrated circuit device.

2. A method of fabricating semiconductor integrated circuit devices according to claim 1, wherein said silicon film comprises a polycrystalline silicon film.

3. A method of fabricating semiconductor integrated circuit devices according to claim 1, wherein said semiconductor region is a source region or a drain region of a MISFET.

4. A method of fabricating semiconductor integrated circuit devices according to claim 1, wherein the heat-treating is performed so as simultaneously to diffuse the impurities to form the semiconductor region and to diffuse the impurities in the silicon film so that the silicon film selectively possesses electric conductivity.

5. A method of fabricating semiconductor integrated circuit devices according to claim 1, including the further step of selectively forming a mask on portions of the silicon film into which the impurities are diffused, and removing parts of the silicon film not covered by said mask, leaving said portions of the silicon film.

6. A method of fabricating semiconductor integrated circuit devices according to claim 1, wherein the silicon film is formed to a thickness of 1000 to 2000 angstroms.

7. A method of fabricating semiconductor integrated circuit devices according to claim 1, wherein the step of forming the silicon film and heat-treating are performed without previously having diffused the introduced impurities.

8. A method of fabricating semiconductor integrated circuit devices according to claim 1, wherein the step of heat-treating is performed in a nitrogen gas atmosphere at a temperature of 900°–1000° C.

9. A method of fabricating semiconductor integrated circuit devices according to claim 1, including the further step of patterning the silicon film so that portions of the silicon film to selectively possess electric conductivity remain.

10. A method of fabricating semiconductor integrated circuit devices according to claim 9, wherein the step of patterning is performed prior to the heat-treating step.

11. A method of fabricating semiconductor integrated circuit devices according to claim 1, wherein said step of forming a silicon film is a step of forming a substantially undoped silicon film.

12. A method of fabricating semiconductor integrated circuit devices according to claim 1, wherein portions of the silicon film selectively possessing electric conductivity are portions on the semiconductor region, the portions selectively possessing electric conductivity being directly in contact with the semiconductor region.

13. A method of fabricating semiconductor integrated circuit devices comprising:
   (a) a step for forming a first semiconductor region of a first type of conductivity and a second semiconductor region of a second type of conductivity on the surface of a semiconductor substrate;
   (b) a step for forming a first electrically conductive film that serves as a gate electrode on the main surface of said semiconductor substrate in each of said first and second semiconductor regions;
   (c) a step for introducing first and second impurities of the second and first types of conductivities into the main surface of said semiconductor substrate in said first and second semiconductor regions, at locations at both ends of the gate electrodes;
   (d) a step for forming a silicon film on the main surface of said semiconductor substrate so as to come into contact with the locations where said first and second impurities are introduced; and
   (e) a step for heat-treating said first and second impurities in order to form a third semiconductor region of the second type of conductivity at both ends of said gate electrode in said first semiconductor region, to form a fourth semiconductor region of the first type of conductivity at both ends of said gate electrode in said second semiconductor region and to diffuse said first and second impurities into said silicon film.

14. A method of fabricating semiconductor integrated circuit devices according to claim 13, wherein said silicon film comprises a polycrystalline silicon film.

15. A method of fabricating semiconductor integrated circuit devices according to claim 13, wherein the heat-treating is performed so as simultaneously to form said third semiconductor region, said fourth semiconductor region and to diffuse said first and second impurities into said silicon film.

16. A method of fabricating semiconductor integrated circuit devices according to claim 13, wherein the heat-treating is performed without previously having diffused the introduced impurities.

17. A method fabricating semiconductor integrated circuit devices according to claim 13, wherein said step of forming a silicon film is a step of forming a substantially undoped silicon film.

18. A method of fabricating semiconductor integrated circuit devices according to claim 13, wherein the first and second impurities are diffused into said silicon film so as to make portions of the silicon film electrically conductive, said portions being directly in contact with the third and fourth semiconductor regions.

19. A method of fabricating semiconductor integrated circuit devices comprising:
   (a) a step for introducing impurities into the main surface of a semiconductor substrate to form a semiconductor region that serves as a source region or a drain region of MISFET;
   (b) a step for forming a silicon film on the main surface of the semiconductor substrate in the source region or the drain region;
   (c) a step for heat-treating the impurities that are introduced to diffuse them in the semiconductor substrate in order to form the source region or the drain region, and further diffusing the impurities in the silicon film so that said silicon film is partly permitted to possess electric conductivity;
   (d) a step for oxidizing the surface of said silicon film to for a thick oxide film on the region in which the impurities are diffused and to form a thin oxide film on the region in which the impurities are not diffused;
   (e) a step for etching the oxide film on the surface of the silicon film to such a degree that the thin oxide film is removed; and
   (f) a step for selectively removing the silicon film from the portions where the impurities are not diffused by using, as a mask, the oxide film that is left on the region where the impurities are diffused.

20. A method of fabricating semiconductor integrated circuit devices according to claim 19, further comprising:
   (g) a step for introducing impurities of the type same as that of said impurities into the silicon film of the region in which said impurities are diffused.

21. A method of fabricating semiconductor integrated circuit devices according to claim 20, further comprising:
   (h) a step for forming an insulating film on the silicon film in the region where said impurities are diffused;
   (i) a step for forming an opening in said insulating film on the silicon film in which said impurities are diffused; and
   (j) a step for forming a wiring layer on said insulating film and in said opening.

22. A method of fabricating semiconductor integrated circuit devices comprising:
   (a) a step for forming a first semiconductor region of a first type of conductivity and a second semiconductor region of a second type of conductivity on the surface of a semiconductor substrate;
   (b) a step for forming a first electrically conductive film that serves as a gate electrode on the main surface of said semiconductor substrate in each of said first and second semiconductor regions;
   (c) a step for introducing first and second impurities of the second and first types of conductivities into the main surface of said semiconductor substrate in said first and second semiconductor regions, at both ends of the gate electrodes;
   (d) a step for forming a silicon film on the main surface of said semiconductor substrate so as to come into contact with the regions where said first and second impurities are introduced;
   (e) a step for heat-treating said first and second impurities in order to form a third semiconductor region of the second type of conductivity at both ends of said gate electrode in said first semiconductor region and to form a fourth semiconductor region of the first type of conductivity at both ends of said gate electrode in said second semiconductor region, and for diffusing said first and second impurities into said silicon film;
   (f) a step for oxidizing the surface of said silicon film in order to form a thick oxide film on the regions where the impurities of the first type of conductivity and of the second type of conductivity are diffused and to form a thin oxide film on the region where the impurities are not diffused;
   (g) a step for etching the oxide film on the surface of said silicon film to such a degree that said thin oxide film is removed; and (h) a step for selectively removing the silicon film from the portions where the impurities are not diffused using, as a mask, the oxide film that is left on the regions where the impurities are diffused.

23. A method of fabricating semiconductor integrated circuit devices according to claim 22, further comprising:

(i) a step for introducing third impurities of the first type of conductivity into portions of said silicon film where the impurities of the first type of conductivity are diffused, and introducing fourth impurities of the second type of conductivity into the portions of said silicon film where the impurities of the second type of conductivity are diffused.

24. A method of fabricating semiconductor integrated circuit devices according to claim 23, further comprising:

(j) a step for forming an insulating film on the silicon film in the region where said impurities are diffused;

(k) a step for forming an opening in said insulating film on the silicon film of the region where said impurities are diffused; and (l) a step for forming a wiring layer on said insulating film and in said opening.

* * * * *